(12) United States Patent
Motoroiu et al.

(10) Patent No.: US 10,727,794 B2
(45) Date of Patent: Jul. 28, 2020

(54) POWER-ON-RESET AND PHASE COMPARATOR FOR CHOPPER AMPLIFIERS

(71) Applicant: Microchip Technology Incorporated, Chandler, AZ (US)

(72) Inventors: Serban Motoroiu, Campina (RO); James Nolan, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 4 days.

(21) Appl. No.: 16/188,686

(22) Filed: Nov. 13, 2018

(65) Prior Publication Data

US 2019/0149108 A1    May 16, 2019

Related U.S. Application Data

(60) Provisional application No. 62/586,540, filed on Nov. 15, 2017.

(51) Int. Cl.
| | |
|---|---|
| *H03F 1/02* | (2006.01) |
| *H03F 3/26* | (2006.01) |
| *H03L 7/085* | (2006.01) |
| *H03F 3/387* | (2006.01) |
| *H03F 3/45* | (2006.01) |

(52) U.S. Cl.
CPC ............... *H03F 3/26* (2013.01); *H03F 3/387* (2013.01); *H03F 3/45475* (2013.01); *H03F 3/45977* (2013.01); *H03L 7/085* (2013.01); *H03F 2200/153* (2013.01); *H03F 2200/261* (2013.01); *H03F 2200/271* (2013.01); *H03F 2200/333* (2013.01)

(58) Field of Classification Search
CPC ................................... H03F 1/02; H03F 3/005
USPC ................................................ 330/9; 327/124
See application file for complete search history.

(56) References Cited

U.S. PATENT DOCUMENTS

| | | | |
|---|---|---|---|
| 9,425,780 B1 * | 8/2016 | Ivanov | ..................... H03K 5/26 |
| 2016/0294331 A1 | 10/2016 | Ivanov | ............................. 330/9 |

FOREIGN PATENT DOCUMENTS

| | | | | |
|---|---|---|---|---|
| JP | 5451762 A | 4/1979 | ............... | H03F 3/38 |

OTHER PUBLICATIONS

Witte, Johan F. et al., "A Current-Feedback Instrumentation Amplifier with 5 μV Offset for Bidirectional High-Side Current-Sensing," IEEE Journal of Solid-State Circuits, vol. 43, No. 12, pp. 2769-2775, Dec. 10, 2008.

(Continued)

*Primary Examiner* — Steven J Mottola
(74) *Attorney, Agent, or Firm* — Slayden Grubert Beard PLLC

(57) ABSTRACT

An apparatus includes an amplifier, an input port, a first modulator circuit connected to the input port, and a correction circuit. The correction circuit is configured to determine a common mode voltage of the input port and receive a first clock signal. The correction circuit is further configured to manipulate, based at least in part upon the common mode voltage of the input port, the first clock signal to generate a second clock signal. The second clock signal is produced for the first modulator circuit. The correction circuit is further configured to determine whether the second clock signal is out of phase with a third clock signal, and, based upon a determination that the second clock signal is out of phase with the third clock signal, reset the second clock signal.

20 Claims, 7 Drawing Sheets

(56) References Cited

OTHER PUBLICATIONS

Pertijs, Miciel A.P. et al., "A 140 dB-CMRR Current Feedback Instrumentation Amplifier Employing Ping-Pong Auto-Zeroing and Chopping," IEEE Journal of Solid-States Circuits, vol. 45, No. 10, pp. 2044-2056, Sep. 24, 2010.
International Search Report and Written Opinion, Application No. PCT/US2018/061185, 16 pages, dated Mar. 28, 2019.

* cited by examiner

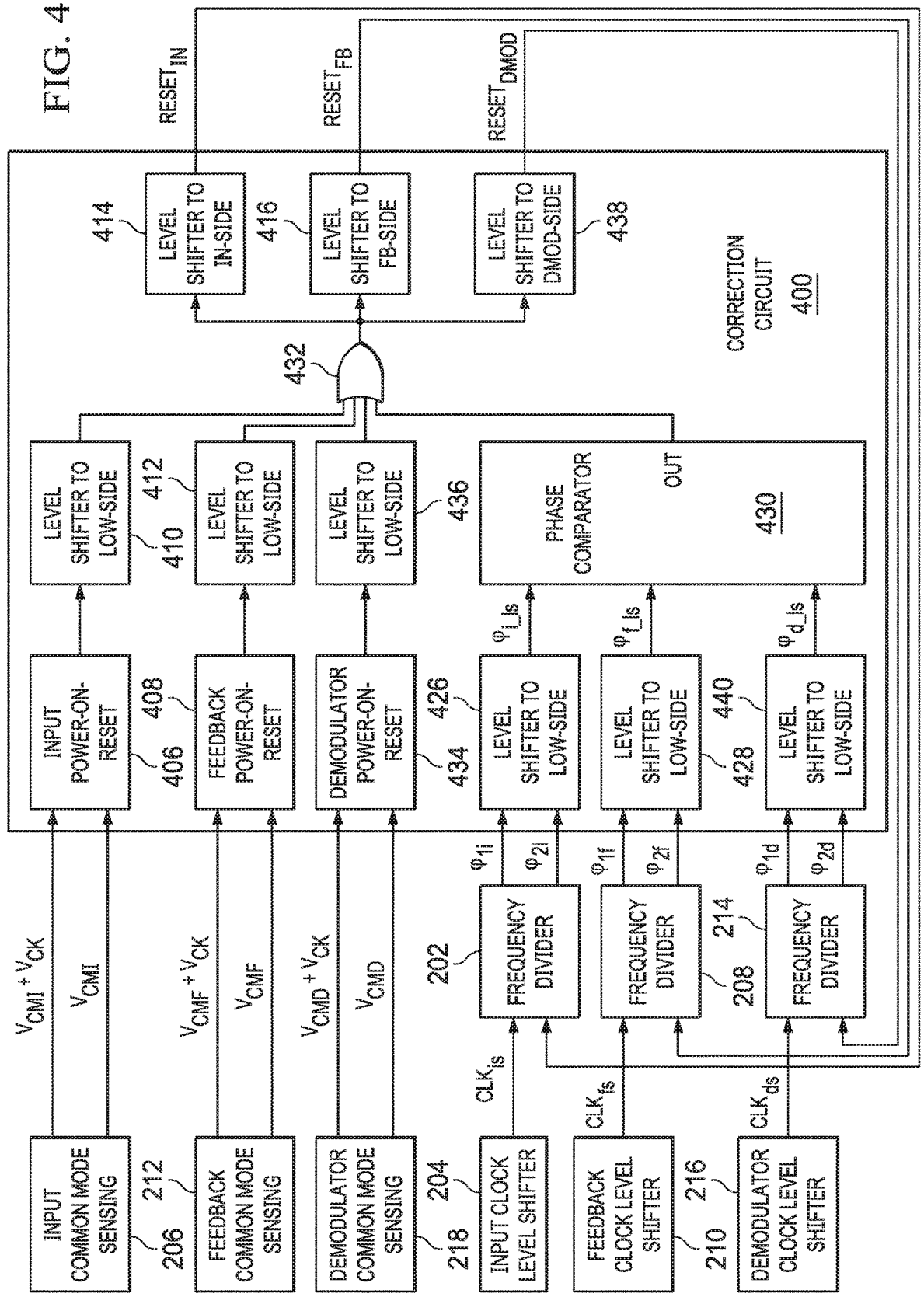

POWER-ON-RESET AND PHASE COMPARATOR FOR CHOPPER AMPLIFIERS

RELATED APPLICATIONS

This application claims priority to U.S. Provisional Patent Application No. 62/586,540 filed Nov. 15, 2017, the contents of which are hereby incorporated in their entirety.

FIELD OF THE INVENTION

The present disclosure relates to amplification circuits and amplifiers for electronic devices and, more particularly, to a power-on-reset and phase comparator for chopper amplifiers.

BACKGROUND

Instrumentation amplifiers may be used to amplify signals generated by sensors such as strain gauges, thermocouples, or low-side or high-side current-sense resistors. Since these signals are in most cases direct current ("DC") or low-frequency voltages and have amplitudes in the order of millivolts or even microvolts, the detection limit of the instrumentation amplifier is determined by errors such as its offset voltage and flicker noise. To correct for these two errors one common method is to use chopping whereby the offset voltage and flicker noise are up-modulated by a clock signal to frequencies higher than the input signal bandwidth where they cannot have a negative impact upon the DC performance.

An indirect-feedback architecture may be chosen for instrumentation amplifiers, in which the feedback signal is applied to a different port from the input signal. These may be referred to as a current-feedback instrumentation amplifier ("CFIA"). Each of an input port and a feedback port may require a voltage-to-current converter (or transconductor) whose purpose is to convert the input and feedback voltages into currents that are then subtracted in order to close the feedback loop. To correct for the offset voltage of a CFIA, chopping must be applied to both the input and feedback transconductors.

The input and feedback transconductors may be designed such that the clocks implementing chopping have amplitudes that depend on (or track) the input and feedback common-mode ("CM") voltages respectively. These voltages are not necessarily equal. The dependence on CM voltages can lead to the input and feedback clocks becoming de-synchronized, or out-of-phase, if the input and feedback CM voltages differ significantly, even for short durations of time, as contemplated by embodiments of the present disclosure.

SUMMARY

Embodiments of the present disclosure include an apparatus. The apparatus may include an amplifier, an input port, a first modulator circuit connected to the input port, and a correction circuit configured to determine a common mode voltage of the input port, receive a first clock signal, manipulate—based at least in part upon the common mode voltage of the input port—the first clock signal to generate a second clock signal, determine whether the second clock signal is out of phase with a third clock signal, and, based upon a determination that the second clock signal is out of phase with the third clock signal, reset the second clock signal. The second clock signal may be produced for the first modulator circuit. In combination with any of the above embodiments, the apparatus may further include a feedback port and a second modulator connected to the feedback port. In such a case, the third clock signal may be produced for the second modulator circuit, and the correction circuit is further configured to determine a common mode voltage of the feedback port from the second modulator circuit, determine whether a voltage event of the common mode voltage of the feedback port has occurred, and reset the second clock signal and reset the third clock signal based upon a determination of occurrence of the voltage event of the common mode voltage of the feedback port, or that the second clock signal produced is out of phase with the third clock signal. In combination with any of the above embodiments, the apparatus may further include a demodulator circuit. In such a case, the third clock signal may be produced for the demodulator circuit, or a fourth clock signal may be produced for the demodulator circuit. In combination with any of the above embodiments, the configuration circuit may be configured to compare the second clock signal with the third clock signal and, if they are not equal, reset the first modulator circuit. In combination with any of the above embodiments, the configuration circuit may be configured to compare the second clock signal with the third clock signal and, if they are not equal, reset the demodulator circuit. In combination with any of the above embodiments, the configuration circuit may be configured to compare the second clock signal with the fourth clock signal and, if they are not equal, reset the first modulator circuit. In combination with any of the above embodiments, the configuration circuit may be configured to compare the second clock signal with the fourth clock signal and, if they are not equal, reset the demodulator circuit. In combination with any of the above embodiments, the amplifier may be of an operational amplifier. In combination with any of the above embodiments, the amplifier may be of an instrumentation amplifier. In combination with any of the above embodiments, the correction circuit is further configured to determine whether a voltage event of the common mode voltage of the input port has occurred. In combination with any of the above embodiments, the voltage event may be an undervoltage, an overvoltage event, or a transient voltage event arising from the common mode voltage of the input port. In combination with any of the above embodiments, the correction circuit may be further configured to, based on a determination of occurrence of the voltage event of the common mode voltage of the input port, reset one or more of the second clock signal, the third clock signal, and the fourth clock signal. In combination with any of the above embodiments, the reset of the clock signals may include a reset of a frequency divider. In combination with any of the above embodiments, the clock signals may be configured to switch inputs controlled by the modulator and demodulator circuits. In combination with any of the above embodiments, the clock signals may be configured to drive gates of transistors in the modulator and demodulator circuits.

Embodiments of the present disclosure may include an amplifier. In some embodiments, the amplifier may be an operational amplifier. In some embodiments, the amplifier may be a CFIA. The amplifier may include any of the apparatuses of the above embodiments.

Embodiments of the present disclosure may include a system. The system may include a voltage source connected to input of any of the amplifiers or apparatuses of the above embodiments.

Embodiments of the present disclosure may include a method. The method may include operations performed by any of the above embodiments of apparatuses, amplifiers, or systems.

BRIEF DESCRIPTION OF THE DRAWINGS

FIG. 4 is a diagram of a correction circuit, according to embodiments of the present disclosure.

DETAILED DESCRIPTION

Figure 1:
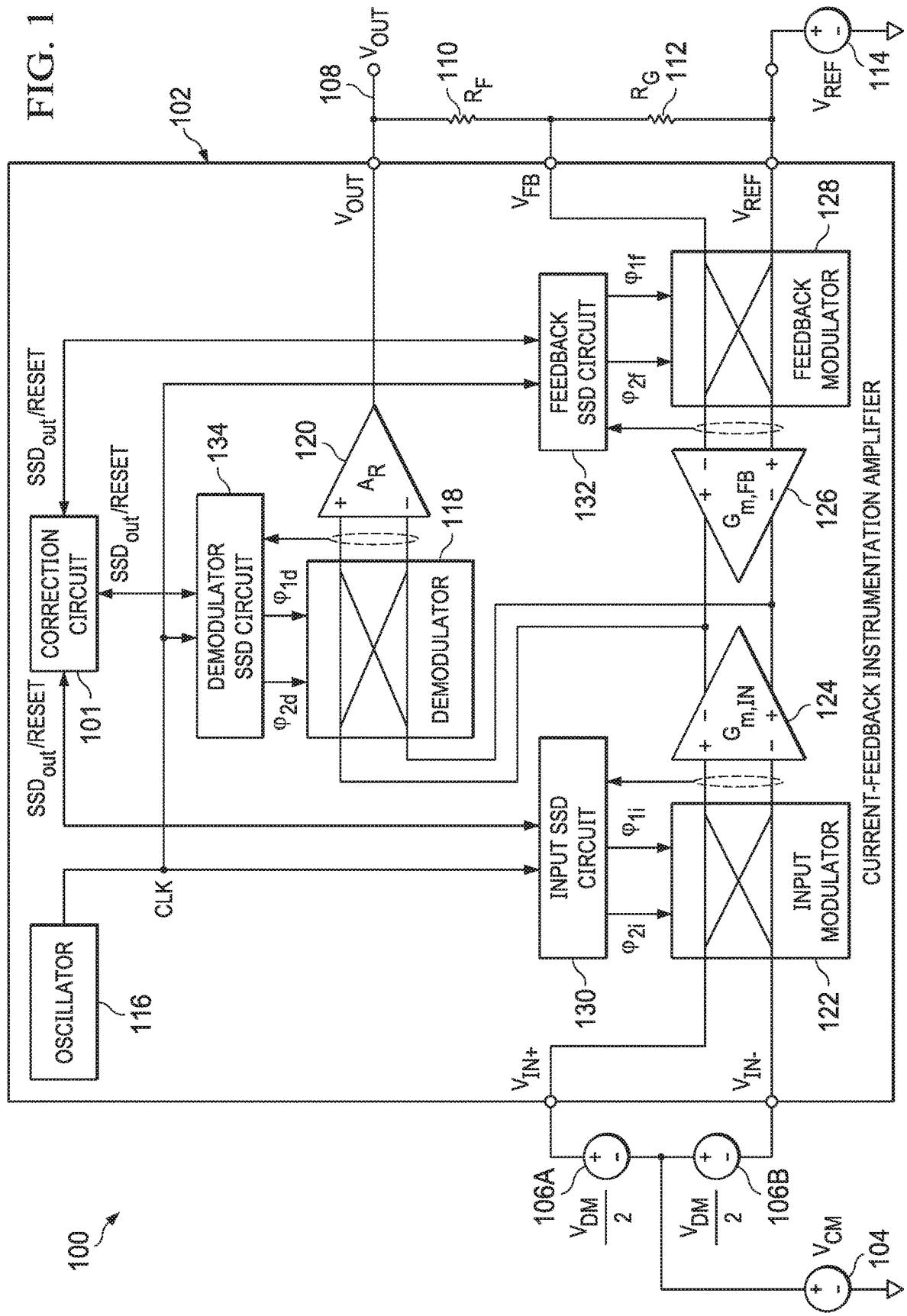
FIG. 1 is a diagram of a system for a chopper CFIA, according to embodiments of the present disclosure.

Embodiments of the present disclosure include an amplifier. In an embodiment, the amplifier is an operational amplifier. In another embodiment, the amplifier is a CFIA. The amplifier includes an input port and an input modulator connected to the input port. The amplifier includes a correction circuit. The correction circuit is configured to determine a common mode voltage of the input port, receive a first clock signal, manipulate—based at least in part upon the common mode voltage of the input port—the first clock signal to generate a second clock signal, determine whether the second clock signal is out of phase with a third clock signal, and, based upon a determination that the second clock signal is out of phase with the third clock signal, reset the second clock signal. In one embodiment, the third clock signal is produced for a feedback modulator. In another embodiment, the third clock signal is produced for a demodulator. In yet another embodiment, the third clock signal is produced for the feedback modulator and a fourth clock signal is produced for the demodulator. In an embodiment, the amplifier includes a feedback port connected to the feedback modulator. In such an embodiment, the third clock signal is produced for the feedback modulator circuit, and the correction circuit is further configured to determine a common mode voltage of the feedback port from the feedback modulator circuit, determine whether a voltage event of the common mode voltage of the feedback port has occurred, and reset the second clock signal and reset the third clock signal based upon a determination of occurrence of the voltage event of the common mode voltage of the feedback port, or that the second clock signal produced is out of phase with the third clock signal. In an embodiment wherein the amplifier includes the demodulator circuit, the configuration circuit is configured to compare the second clock signal with the clock signal generated for the demodulator circuit and, if they are not equal, reset the input modulator circuit. In a further embodiment, the correction circuit is configured to also reset the demodulator circuit and a feedback modulator circuit, if present. In an embodiment, the correction circuit is configured to determine whether a voltage event of the common mode voltage of the input port has occurred. In a further embodiment, the voltage event is one of an undervoltage, an overvoltage event, or a transient voltage event arising from the common mode voltage of the input port. In another, further embodiment, the correction circuit is further configured to, based on a determination of occurrence of the voltage event of the common mode voltage of the input port or of the common mode voltage of the feedback port, reset one or more of the second clock signal, the third clock signal, and the fourth clock signal. In various embodiments, the reset of the clock signals includes a reset of a frequency divider. In various embodiments, the clock signals are configured to switch inputs controlled by the modulator and demodulator circuits. In various embodiments, the clock signals are be configured to drive gates of transistors in the modulator and demodulator circuits.

FIG. 1 is a diagram of a system 100 for a CFIA 102, according to embodiments of the present disclosure. CFIA 102 may be a chopper CFIA. System 100 may include CFIA 102, signal sources, and an output 108. A first signal source may be modeled as a common-mode voltage source $V_{CM}$ 104 added to the midpoint of two differential voltage sources 106A, 106B connected in series. Voltage sources 106A, 106B may each have a voltage of a differential voltage ("DM") divided by two, given as $V_{DM}/2$. Voltage sources 106A, 106B may be connected in series together and connected across a pair of input ports $V_{IN+}$ and $V_{IN-}$ of CFIA 102. $V_{CM}$ 104 may be equal to the sum of $V_{IN+}$ and $V_{IN-}$, divided by two. $V_{DM}$ may be equal to the difference between $V_{IN+}$ and $V_{IN-}$. A second signal source may be a reference voltage, $V_{REF}$ 114.

CFIA 102 may include two input ports for input voltage—$V_{IN+}$ and $V_{IN-}$—and two input ports for feedback voltage—$V_{FB}$ and $V_{REF}$. Input voltage may be described by $V_{CM}$ 104 and voltage sources 106A, 106B. Feedback voltage may be received from output voltage $V_{OUT}$ 108 fed back to the $V_{FB}$ terminal through a resistor network including resistors $R_F$ 110 and $R_G$ 112. A top terminal of $R_F$ 110 may be connected to $V_{OUT}$ 108. A bottom terminal of $R_F$ 110 may be connected to a top terminal of $R_G$ 112. The bottom terminal of $R_F$ 110 may further be connected to the $V_{FB}$ input terminal of CFIA 102. The bottom terminal of $R_G$ 112 may be connected to the reference voltage, $V_{REF}$ 114, which may also be input into CFIA 102 at the $V_{REF}$ terminal.

CFIA 102 may include two input stages. Each input stage may include a respective transconductor 124, 126. Transconductors 124, 126 may be assigned, respectively to input ports $V_{IN+}$ and $V_{IN-}$ and feedback ports $V_{FB}$ and $V_{REF}$. Transconductors 124, 126 may each be a voltage-to-current converter whose output may be summed in a current domain and passed to a second stage amplifier 120. The output of each of transconductors 124, 126 may be a differential output. This output may be prone to errors such as offset voltage, low-frequency noise or 1/f noise (e.g. flicker noise), and gain error. To correct for offset voltage and flicker noise errors of transconductors 124, 126, one method is to use chopping, whereby modulators such as input modulator 122 and feedback modulator 128 may be used at the inputs of transconductors 124, 126, respectively. Modulators 122, 128 may thus be the "choppers" of CFIA 102 implemented as a chopper CFIA. The summed output of transconductors 124, 126 may be passed to a demodulator 118 at the input of amplifier 120.

Figure 2A:
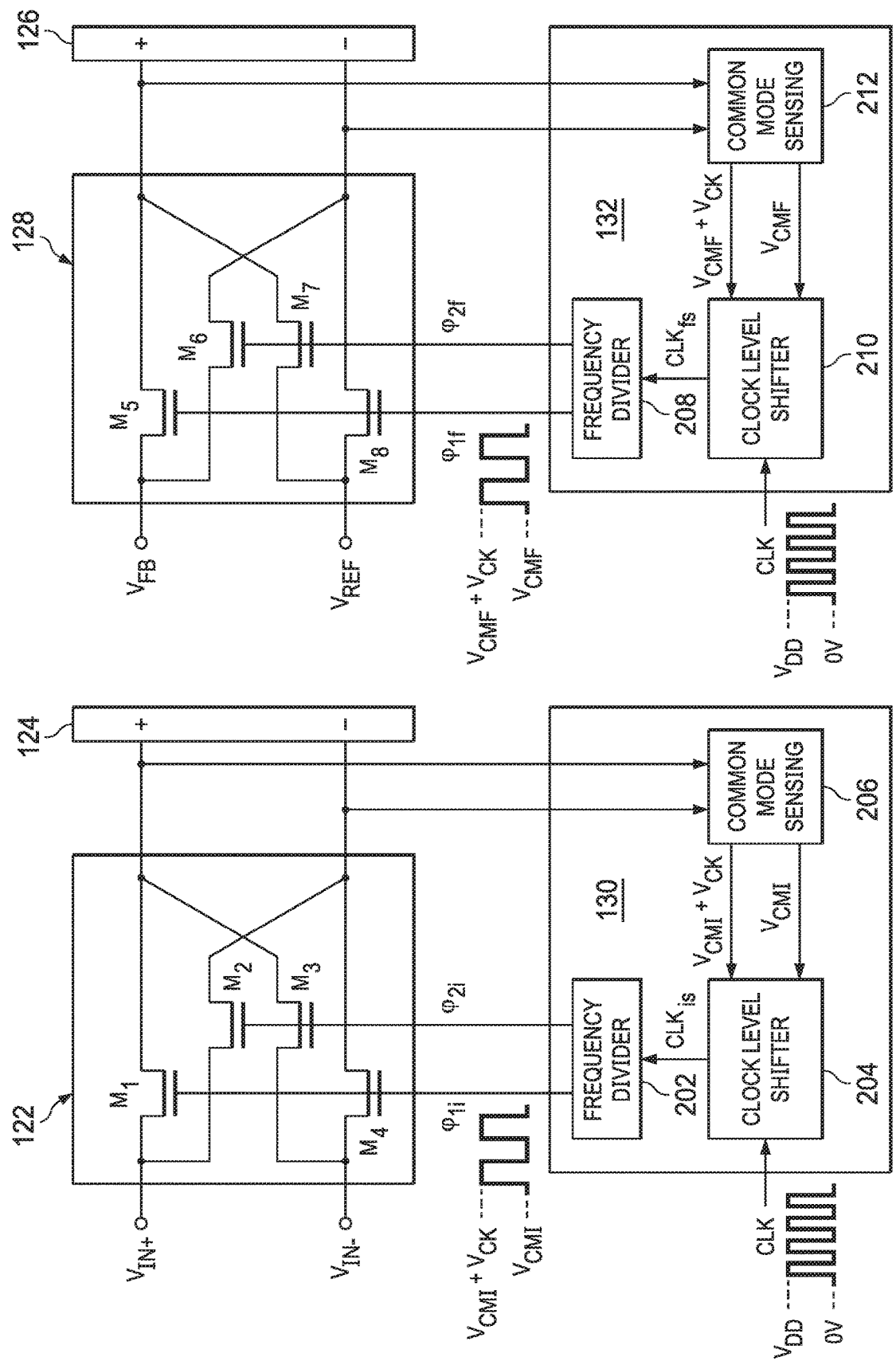
FIGS. 2A and 2B are more detailed diagrams of portions of a chopper CFIA, according to embodiments of the present disclosure.
Figure 2B:
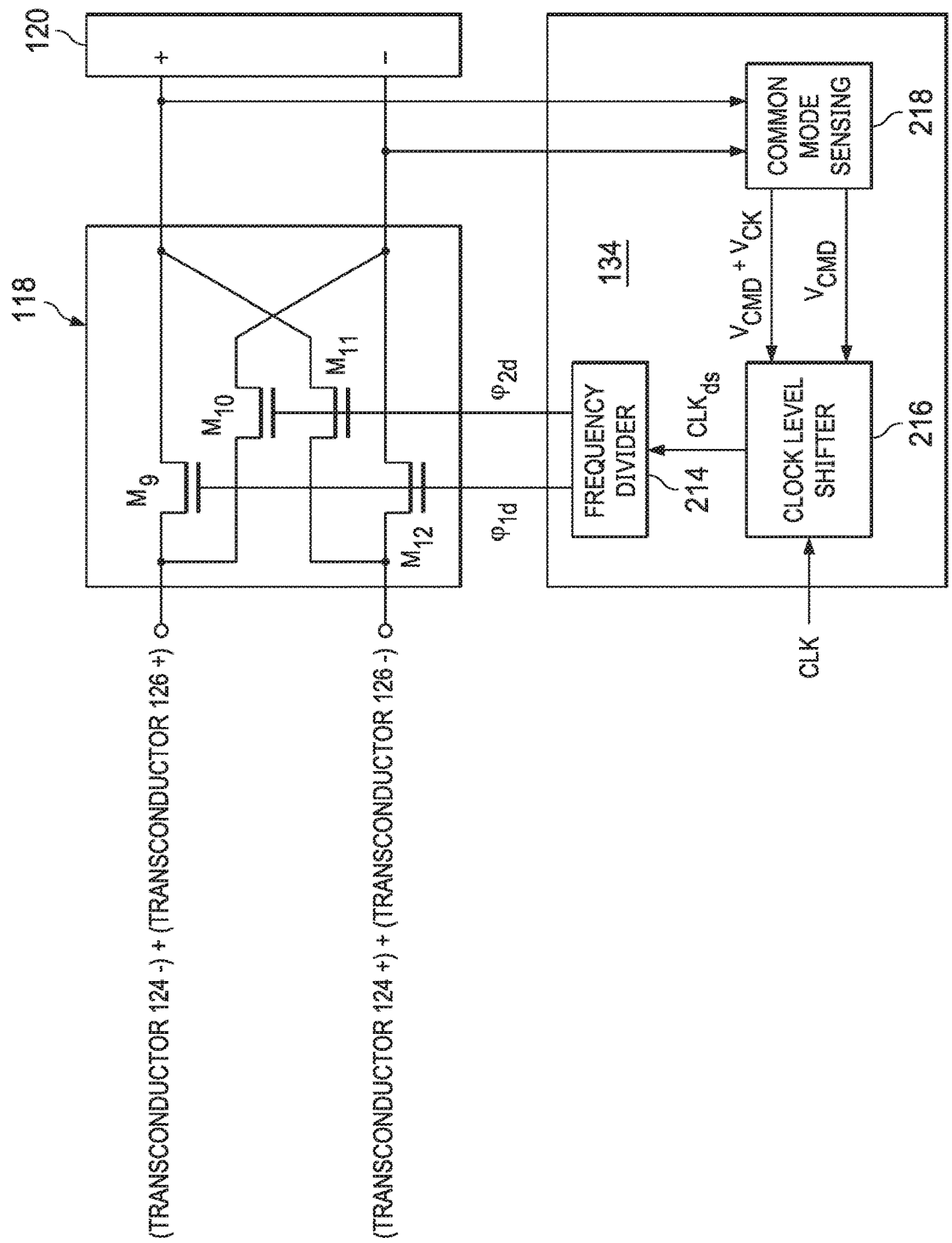

Modulators 122, 128 may be configured to periodically swap their positive and negative inputs. Demodulator 118 may be configured to undo the operations of modulators 122, 128. Such operations may be controlled by a common clock. The common clock may be a received clock, or may be generated by, for example, an oscillator 116. Modulators 122, 128 and demodulator 118 may be implemented by analog circuitry, digital circuitry, or any combination thereof. For example, modulators 122, 128 may be implemented by metal oxide semiconductor (MOS) transistors. Implementations of modulators 122, 128 are shown in further detail below in FIGS. 2A and 2B. Operation of modulators 122, 128 and demodulator 118 may be controlled, monitored, or otherwise affected by respective circuits 130, 132, 134. Circuits 130, 132, 134 may be configured to perform one or more functions of sensing ("S") common mode voltage; shifting ("S") voltage levels to match requirements of modulators 122, 128 and demodulator 118; and performing frequency division ("D") ("SSD"). Thus, circuits 130, 132, 134 may be referred to as input SSD circuit 130, feedback SSD circuit 132, and demodulator SSD circuit 134. Input SSD circuit 130, feedback SSD circuit 132, and demodulator SSD circuit 134 may be implemented by analog circuitry, digital circuitry, or any combination thereof. FIGS. 2A and 2B below illustrate example implementations of input SSD circuit 130, feedback SSD circuit 132, and demodulator SSD circuit 134. Although shown as being implemented separately from modulators 122, 128 and demodulator 118, in various embodiments input SSD circuit 130 may be implemented within modulator 122, feedback SSD circuit 132 may be implemented within modulator 128, and demodulator SSD circuit 134 may be implemented within demodulator 118.

Oscillator 116 may be implemented in any suitable manner, such as by an R-C circuit, analog circuitry, digital circuitry, or any combination thereof. Oscillator 116 may be configured to issue a clock signal CLK to other elements of CFIA 102. CLK may be provided to input SSD circuit 130, demodulator SSD circuit 134, and feedback SSD circuit 132. Input SSD circuit 130, feedback SSD circuit 132, and demodulator SSD circuit 134 may be configured to manipulate CLK to drive gate terminals of transistors in modulators 122, 128 and demodulator 118. Input SSD circuit 130, feedback SSD circuit 132, and demodulator SSD circuit 134 may each generate two separate signals—referred to generally as $\varphi_1$ and $\varphi_2$. The signals $\varphi_1$ and $\varphi_2$ may be generated through manipulation of CLK, such as level-shifting and frequency dividing CLK. The signals $\varphi_1$ and $\varphi_2$ may be configured to control the operation of modulators 122, 128 and demodulator 118. Specifically, input SSD circuit 130 may be configured to generate $\varphi 1$, and $\varphi_{2i}$, feedback SSD circuit 132 may be configured to generate $\varphi_{1f}$ and $\varphi_{2f}$, and demodulator SSD circuit 134 may be configured to generate $\varphi_{1d}$ and $\varphi_{2d}$. A given pair of $\varphi_1$ and $\varphi_2$ signals may be the inverse, complement, or 180° phase-shifted version of each other. For example, $\varphi_{1d}$ and $\varphi_{2d}$ may each be square waves of a same frequency and amplitude that are the inverse of each other.

Modulators 122, 128 may be configured to periodically swap the respective negative and positive inputs of transconductors 124, 126. By swapping positive and negative inputs of transconductors 124, 126, offset voltages and flicker noise may be corrected. Offset voltages may be an error caused by any mismatch between the positive and negative paths within transconductors 122, 128 or demodulator 118, caused by mismatches in production of circuits or transistors implementing such positive and negative paths. Ideally, such paths would be completely symmetrical without an offset, but in practice an offset may occur because transistors cannot be produced that are identical. Flicker noise may be low frequency noise for which the noise power is inversely proportional to the frequency. Because flicker noise is inversely proportional to frequency, flicker noise is largest at low frequencies, such as those frequencies close to DC.

Modulators 122, 128 may be configured to periodically swap the respective negative and positive inputs of transconductors 124, 126 at a rate equal to half (or less) of the frequency of CLK. The positive and negative inputs of transconductors 124, 126 may be swapped by application of respective $\varphi_1$ and $\varphi_2$ signals to gates of transistors of modulators 122, 128. The $\varphi_1$ and $\varphi_2$ signals may be based in part upon common mode voltage sensing of inputs of transconductors 124, 126 performed by input SSD circuit 130 and feedback SSD circuit 132. For example, $\varphi_{1i}$ and $\varphi_{2i}$ may be generated by input SSD circuit 130 based at least in part upon common mode voltage sensed at the inputs of transconductor 124. $\varphi_{1f}$ and $\varphi_{2f}$ may be generated by feedback SSD circuit 132 based upon common-mode voltage sensed at the inputs of transconductor 126. $\varphi_{1d}$ and $\varphi_{2d}$ may be generated by demodulator SSD circuit 134 based upon common-mode voltage sensed at the inputs of amplifier 120. Demodulator 118 may be configured to periodically swap the respective negative and positive inputs of amplifier 120 at a rate equal to half (or less) of the frequency of CLK. The positive and negative inputs of amplifier 120 may be swapped by application of respective $\varphi_{1d}$ and $\varphi_{2d}$ signals to gates of transistors of demodulator 118. A positive input of amplifier 120 may be otherwise connected to a negative output of transconductor 124 and a positive output of transconductor 126. A negative input of amplifier 120 may be otherwise connected to a positive output of transconductor 124 and a negative output of transconductor 126. By swapping positive and negative inputs of amplifier 120, offset voltages and flicker noise may be corrected. Demodulator 118 may be configured to periodically swap the respective negative and positive inputs of amplifier 120 at a rate according to the frequency of control signals $\varphi_{1d}$ and $\varphi_{2d}$, which are half (or less) of CLK, as will be explained further below. Demodulator 118 may be implemented by a series of switches or transistors to swap positive and negative inputs of amplifier 120. The switches or transistors may be controlled by $\varphi_{1d}$ and $\varphi_{2d}$ signals.

In one embodiment, input SSD circuit 130, feedback SSD circuit 132, and demodulator SSD circuit 134 may be configured to provide information to a correction circuit 101. For example, input SSD circuit 130, feedback SSD circuit 132, and demodulator SSD circuit 134 may be configured to provide information (labeled "SSD$_{out}$" in FIG. 1) to correction circuit 101. The information in SSD$_{out}$ may include signals $\varphi_{1i}$, $\varphi_{2i}$, $\varphi_{1f}$, $\varphi_{2f}$, $\varphi_{1d}$, and $\varphi_{2d}$. As indicated above, these signals may be derived from CLK. Input SSD circuit 130, feedback SSD circuit 132, and demodulator SSD circuit 134 may be configured to provide other suitable information to correction circuit 101 in SSD$_{out}$ such as information about the sensed common mode voltages from the inputs of transconductors 124, 126 and amplifier 120. Correction circuit 101 may be configured to ensure that signals used by input SSD circuit 130, feedback SSD circuit 132, and demodulator SSD circuit 134—such as $\varphi_{1i}$, $\varphi_{2i}$, $\varphi_{1f}$, $\varphi_{2f}$, $\varphi_{1d}$, and $\varphi_{2d}$—are working in-phase. More precisely correction circuit 101 ensures that signals $\varphi_{1i}$, $\varphi_{1f}$, and $\varphi_{1d}$ are working in-phase with respect to one another, and that signals $\varphi_{2i}$, $\varphi_{2f}$, and $\varphi_{2d}$ are working in-phase with respect to one another. Correction circuit 101 may be configured to ensure that such signals are working in-phase by issuing reset signals (labeled "reset" in FIG. 1) to input SSD circuit 130, feedback SSD circuit 132, and demodulator SSD circuit 134. Correction circuit 101 may be implemented by analog circuitry, digital circuitry, or any suitable combination thereof. Correction circuit 101 may include power-on-reset circuits, decision logic, and phase comparators. Correction circuit 101 may be used in any suitable application, such as the chopper CFIA shown in FIG. 1, or in any application wherein clocks in different voltage domains must be ensured to be working in-phase.

Correction circuit 101 may be configured to reset portions of input SSD circuit 130, feedback SSD circuit 132, and demodulator SSD circuit 134. Such a reset may be applied to frequency manipulation circuits of input SSD circuit 130, feedback SSD circuit 132, and demodulator SSD circuit 134. Resetting may be based upon $\varphi_1$ and $\varphi_2$ signals from input SSD circuit 130, feedback SSD circuit 132, and demodulator SSD circuit 134 being out of phase with one another, or upon power-on transient conditions that are detected.

FIGS. 2A and 2B illustrate a more detailed view of portions of CFIA 102, including input SSD circuit 130, feedback SSD circuit 132, demodulator SSD circuit 134, modulator 122, modulator 128, demodulator 118, transconductor 124, transconductor 126, and amplifier 120, according to embodiments of the present disclosure. Input SSD circuit 130 may include a clock ("CK") level shifter 204, a frequency divider 202, and a common mode sensing circuit 206. Feedback SSD circuit 132 may include a CK level shifter 210, a frequency divider 208, and a common mode sensing circuit 212. Demodulator SSD circuit 134 may include a CK level shifter 216, a frequency divider 214, and a common mode sensing circuit 218. CK level shifters 204, 210, 216, frequency dividers 202, 208, 214, and common mode sensing circuits 206, 212, 218 may be implemented by analog circuitry, digital circuitry, or any suitable combination thereof.

CLK, issued by oscillator 116, may be a square wave at a given frequency oscillating between 0V and $V_{DD}$, where $V_{DD}$ may be a supply voltage for the oscillator, which may typically be five volts or less. The clock signal may be received at CK level shifters 204, 210, 216.

CM sensing circuit 206 may be configured to detect a common mode voltage as an input into transconductor 124. In particular, CM sensing circuit 206 may be configured to detect a common mode voltage that appears on inputs $V_{IN-}$ and $V_{IN+}$. CM sensing circuit 206 may be configured to monitor any point between the terminals $V_{IN-}$ and $V_{IN+}$ and transconductor 124. CM sensing circuit 206 may be configured to output the detected level of common mode voltage, $V_{CMI}$. CM sensing circuit 206 may be configured to pass the $V_{CMI}$ voltage to CK level shifter 204. Moreover, CM sensing circuit 206 may be configured to output another voltage to CK level shifter 204 equal to \Tom plus an offset voltage, $V_{CK}$. $V_{CK}$ may be the amplitude of CLK after level-shifting operations performed by CK level shifter 204. The voltages $V_{CMI}$ and $(V_{CMI}+V_{CK})$ may act as power supplies to CK level shifter 204 and to frequency divider 202 (power supply connection to frequency divider 202 not shown).

CK level shifter 204 may be configured to shift voltage levels of the received clock signal CLK to a voltage domain matching the common-mode voltage level of received input voltage for CFIA 102. CLK, as received, may oscillate between 0V and $V_{DD}$. The voltage level to which CLK may be shifted may be the sensed common-mode voltage of the input port, which is $V_{CMI}$ and may be given by $(V_{IN+}+V_{IN-})/2$. The resulting signal after such shifting may be denoted as $CLK_{is}$. CK level shifter 204 may be powered by voltage rails $V_{CMI}$ and $(V_{CMI}+V_{CK})$. Thus, the minimum value of $CLK_{is}$ may be $V_{CMI}$ and the maximum value may be $(V_{CMI}+V_{CK})$. The amplitude of $CLK_{is}$ may be $V_{CK}$.

CK level shifter 204 may be configured to provide $CLK_{is}$ to frequency divider 202. Frequency divider 202 may be configured to divide the frequency of $CLK_{is}$. For example, frequency divider 202 may divide the frequency of $CLK_{is}$ by two. Frequency divider 202 may ensure that the resulting divided signal clock has a 50% duty cycle after level shifting. Level shifting performed by CK level shifter 204 may have corrupted the signal. If the resulting signal does not have a 50% duty cycle, incomplete offset correction and gain error may result. Frequency division may be implemented in any suitable manner.

Frequency divider 202 may be configured to divide the frequency of $CLK_{is}$ and provide the result thereof. This divided-frequency signal may be given as $\varphi_{1i}$. Furthermore, frequency divider 202 may be configured to output $\varphi_{2i}$, which may be a complementary signal that is 180° phase-shifted from $\varphi_{1i}$. Frequency divider 202 may be configured to provide $\varphi_{1i}$ and $\varphi_{2i}$ to gates of different transistors of modulator 122 so that inputs to transconductor 124 are periodically reversed.

Modulator 122 may be implemented in any suitable manner. For example, modulator 122 may include MOS transistors M1-M4. The source of M1 and the source of M2 may be connected to $V_{IN+}$. The source of M3 and the source of M4 may be connected to $V_{IN-}$. The drain of M1 and the drain of M3 may be connected to the positive input of transconductor 124. The drain of M2 and the drain of M4 may be connected to the negative input of transconductor 124. The gates of M1 and M4 may be connected to $\varphi_{1i}$ while the gates of M2 and M3 may be connected to $\varphi_{2i}$. Accordingly, in operation when $\varphi_{1i}$ is high and $\varphi_{2i}$ is low, $V_{IN+}$ may be routed through M1 to the positive input of transconductor 124 and $V_{IN-}$ may be routed through M4 to the negative input of transconductor 124. When $\varphi_{1i}$ is low and $\varphi_{2i}$ is high, $V_{IN+}$ may be routed through M2 to the negative input of transconductor 124 and $V_{IN-}$ may be routed through M3 to the positive input of transconductor 124. Thus, input from $V_{IN+}$ and $V_{IN-}$ may be periodically swapped as-applied to the positive and negative inputs of transconductor 124.

Feedback SSD circuit 132 may be implemented in a similar manner to input SSD circuit 130. In feedback SSD circuit 132, CM sensing circuit 212 may be configured to detect a common mode voltage as an input into transconductor 126. In particular, CM sensing circuit 212 may be configured to detect a common mode voltage that appears on inputs $V_{FB}$ and $V_{REF}$. CM sensing circuit 212 may be configured to monitor any point between the terminals $V_{FB}$ and $V_{REF}$ and transconductor 126. CM sensing circuit 212 may be configured to output the detected level of common mode voltage, $V_{CMF}$. CM sensing circuit 212 may be configured to pass the $V_{CMF}$ voltage to CK level shifter 210. Moreover, CM sensing circuit 212 may be configured to output another voltage to CK level shifter 210 equal to $V_{CMF}$ plus an offset voltage, $V_{CK}$. $V_{CK}$ may be the amplitude of CLK after level-shifting operations performed by CK level shifter 210. There is no requirement that the amplitude of CLK after level-shifting operations performed by CK level shifter 210 be the same as the amplitude of CLK after level-shifting operations by CK level shifter 204. The voltages $V_{CMF}$ and $(V_{CMF}+V_{CK})$ may act as power supplies to CK level shifter 210 and to frequency divider 208 (power supply connection to frequency divider 208 not shown).

CK level shifter 210 may be configured to shift voltage levels of the received clock signal CLK to a voltage domain matching the common-mode voltage level of received feedback voltage for CFIA 102. CLK, as received, may oscillate between 0V and $V_{DD}$. The voltage level to which CLK may be shifted may be the sensed common-mode voltage of the feedback port, which is $V_{CMF}$ and may be given by $(V_{FB}+V_{REF})/2$. The resulting signal after such shifting may be denoted as $CLK_{fs}$. CK level shifter 210 may be powered by voltage rails $V_{CMF}$ and $(V_{CMF}+V_{CK})$. Thus, the minimum value of $CLK_{fs}$ may be $V_{CMF}$ and the maximum value may be $(V_{CMF}+V_{CK})$. The amplitude of CLK, may be $V_{CK}$.

CK level shifter 210 may be configured to provide $CLK_{fs}$ to frequency divider 208. Frequency divider 208 may be configured to divide the frequency of $CLK_{fs}$. For example, frequency divider 208 may divide the frequency of $CLK_{fs}$ by two. Frequency divider 208 may ensure that the resulting divided signal clock has a 50% duty cycle after level shifting. Level shifting performed by CK level shifter 208 may have corrupted the signal. If the resulting signal does not have a 50% duty cycle, incomplete offset correction and gain error may result. Frequency division may be implemented in any suitable manner.

Frequency divider 208 may be configured to divide the frequency of $CLK_{fs}$ and provide the result thereof. This divided-frequency signal may be given as $\varphi_{1f}$. Furthermore, frequency divider 208 may be configured to output $\varphi_{2f}$, which may be a complementary signal that is 180° phase-shifted from $\varphi_{1f}$. Frequency divider 208 may be configured to provide $\varphi_{1f}$ and $\varphi_{2f}$ to gates of different transistors of modulator 128 so that inputs to transconductor 126 are periodically reversed.

Modulator 128 may be implemented in any suitable manner. For example, modulator 128 may include MOS transistors M5-M8. The source of M5 and the source of M6 may be connected to $V_{FB}$. The source of M7 and the source of M8 may be connected to $V_{REF}$. The drain of M5 and the drain of M7 may be connected to the positive input of transconductor 126. The drain of M6 and the drain of M8 may be connected to the negative input of transconductor 126. The gates of M5 and M8 may be connected to $\varphi_{1f}$ while the gates of M6 and M7 may be connected to $\varphi_{2f}$. Accordingly, in operation when $\varphi_{1f}$ is high and $\varphi_{2f}$ is low, $V_{FB}$ may be routed through M5 to the positive input of transconductor 126 and $V_{REF}$ may be routed through M8 to the negative input of transconductor 126. When $\varphi_{1f}$ is low and $\varphi_{2f}$ is high, $V_{FB}$ may be routed through M6 to the negative input of transconductor 126 and $V_{REF}$ may be routed through M7 to the positive input of transconductor 126. Thus, input from $V_{FB}$ and $V_{REF}$ may be periodically swapped as-applied to the positive and negative inputs of transconductor 126.

Demodulator SSD circuit 134 may be implemented in a similar manner to input SSD circuit 130 and feedback SSD circuit 132. In demodulator SSD circuit 134, CM sensing circuit 218 may be configured to detect a common mode voltage as an input into amplifier 120. In particular, CM sensing circuit 218 may be configured to detect a common mode voltage that appears on the positive input of amplifier 120 (negative output of transconductor 124 plus positive output of transconductor 126) and the negative input of amplifier 120 (positive output of transconductor 124 plus negative output of transconductor 126). CM sensing circuit 218 may be configured to monitor any point between the outputs of transconductors 124, 126 and inputs of amplifier 120. CM sensing circuit 218 may be configured to output the detected level of common mode voltage, $V_{CMD}$. CM sensing circuit 218 may be configured to pass the $V_{CMD}$ voltage to CK level shifter 216. Moreover, CM sensing circuit 218 may be configured to output another voltage to CK level shifter 216 equal to $V_{CMD}$ plus an offset voltage, $V_{CK}$. $V_{CK}$ may be the amplitude of CLK after level-shifting operations performed by CK level shifter 216. There is no requirement that the amplitude of CLK after level-shifting operations performed by CK level shifter 216 be the same as the amplitude of CLK after level-shifting operations by CK level shifter 204 or by CK level shifter 210. The voltages $V_{CMD}$ and $(V_{CMD}+V_{CK})$ may act as power supplies to CK level shifter 216 and to frequency divider 214 (power supply connection to frequency divider 208 not shown).

CK level shifter 216 may be configured to shift voltage levels of the received clock signal CLK to a voltage domain matching the common-mode voltage level of inputs for amplifier 120. CLK, as received, may oscillate between 0V and $V_{DD}$. The voltage level to which CLK may be shifted may be the sensed common-mode voltage of inputs of amplifier 120. The resulting signal after such shifting may be denoted as $CLK_{ds}$. CK level shifter 216 may be powered by voltage rails $V_{CMD}$ and $(V_{CMD}+V_{CK})$. Thus, the minimum value of $CLK_{ds}$ may be $V_{CMD}$ and the maximum value may be $(V_{CMD}+V_{CK})$. The amplitude of $CLK_{ds}$ may be $V_{CK}$.

CK level shifter 216 may be configured to provide $CLK_{ds}$ to frequency divider 214. Frequency divider 214 may be configured to divide the frequency of $CLK_{ds}$. For example, frequency divider 214 may divide the frequency of $CLK_{ds}$ by two. Frequency divider 214 may ensure that the resulting signal clock has a 50% duty cycle after level shifting. Level shifting performed by CK level shifter 216 may have corrupted the signal. If the resulting signal does not have a 50% duty cycle, incomplete offset correction and gain error may result. Frequency division may be implemented in any suitable manner.

Frequency divider 214 may be configured to divide the frequency of $CLK_{ds}$ and provide the result thereof. This divided-frequency signal may be given as $\varphi_{1d}$. Furthermore, frequency divider 214 may be configured to output $\varphi_{2d}$, which may be a complementary signal that is 180° phase-shifted from $\varphi_{1d}$. Frequency divider 208 may be configured to provide $\varphi_{1d}$ and $\varphi_{2d}$ to gates of different transistors of demodulator 118 so that inputs to amplifier 120 are periodically reversed. Demodulator 118 may be implemented in any suitable manner.

Demodulator 118 may be implemented in any suitable manner. For example, demodulator 118 may include MOS transistors M9-M12. The source of M9 and the source of M10 may be connected to the negative output of transconductor 124 and positive output transconductor 126. The source of M11 and the source of M12 may be connected to the positive output of transconductor 124 and negative output of transconductor 126. The drain of M9 and the drain of M11 may be connected to the positive input of amplifier 120. The drain of M10 and the drain of M12 may be connected to the negative input of amplifier 120. The gates of M9 and M12 may be connected to $\varphi_{1d}$ while the gates of M10 and M11 may be connected to $\varphi_{2d}$. Accordingly, in operation when $\varphi_{1d}$ is high and $\varphi_{2d}$ is low, the negative output of transconductor 124 and positive output of transconductor 126 may be routed through M9 to the positive input of amplifier 120, and the positive output of transconductor 124 and negative output of transconductor 126 may be routed through M12 to the negative input of amplifier 120. When $\varphi_{1d}$ is low and $\varphi_{2d}$ is high, the negative output of transconductor 124 and positive output of transconductor 126 may be routed through M10 to the negative input of amplifier 120, and the positive output of transconductor 124 and negative output of transconductor 126 may be routed through M11 to the positive input of amplifier 120. Thus, the negative output of transconductor 124 and the positive output of transconductor 126 on the one hand, and the positive output of transconductor 124 and negative output of transconductor 126 on the other hand, may be periodically swapped as-applied to the positive and negative inputs of amplifier 120.

Input SSD circuit 130 may be configured to receive CLK and manipulate CLK in order to generate the $\varphi_{1i}$ and $\varphi_{2i}$ signals. The manipulation of CLK in order to generate the $\varphi_{1i}$ and $\varphi_{2i}$ signals may be performed at least in part through the determination or sensing of $V_{CMI}$. For example, CK level shifter 204 may be configured to shift the amplitude of CLK from the range of $(0 \ldots V_{DD})$ to the range of $(V_{CMI} \ldots V_{CMI}+V_{CK})$. In addition, CK level shifter 204 may be powered by voltage rails $V_{CMI}$ and $(V_{CMI}+V_{CK})$. Furthermore, frequency divider 202 may be powered by voltage rails $V_{CMI}$ and $(V_{CMI}+V_{CK})$.

Feedback SSD circuit 132 may be configured to receive CLK and manipulate CLK in order to generate the $\varphi_{1f}$ and $\varphi_{2f}$ signals. The manipulation of CLK in order to generate the $\varphi_{1f}$ and $\varphi_{2f}$ signals may be performed at least in part through the determination or sensing of $V_{CMF}$. For example, CK level shifter 210 may be configured to shift the amplitude of CLK from the range of $(0 \ldots V_{DD})$ to the range of $(V_{CMF} \ldots V_{CMF}+V_{CK})$. In addition, CK level shifter 210 may be powered by voltage rails $V_{CMF}$ and $(V_{CMF}+V_{CK})$. Furthermore, frequency divider 208 may be powered by voltage rails $V_{CMF}$ and $(V_{CMF}+V_{CK})$.

Demodulator SSD circuit 134 may be configured to receive CLK and manipulate CLK in order to generate the $\varphi_{1d}$ and $\varphi_{2d}$ signals. The manipulation of CLK in order to generate the $\varphi_{1d}$ and $\varphi_{2d}$ signals may be performed at least in part through the determination or sensing of $V_{CMD}$. For example, CK level shifter 216 may be configured to shift the amplitude of CLK from the range of $(0 \ldots V_{DD})$ to the range of $(V_{CMD} \ldots V_{CMD}+V_{CK})$. In addition, CK level shifter 216 may be powered by voltage rails $V_{CMD}$ and $(V_{CMD}+V_{CK})$. Furthermore, frequency divider 214 may be powered by voltage rails $V_{CMD}$ and $(V_{CMD}+V_{CK})$.

Figure 3:
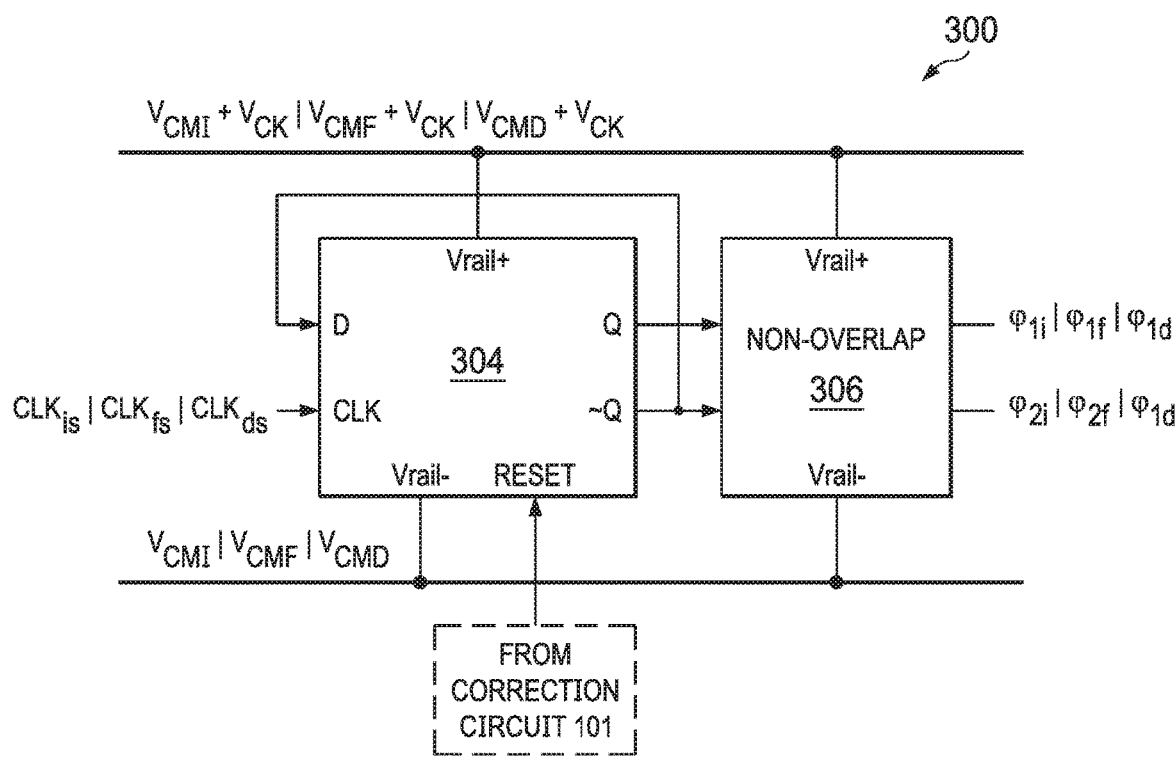
FIG. 3 is a diagram of a frequency divider, according to embodiments of the present disclosure.

FIG. 3 illustrates an example frequency divider 300, in accordance with embodiments of the present disclosure. Circuit 300 may implement frequency dividers 202, 208, 214.

Frequency division may be performed with a D flip-flop ("DFF") 304. DFF 304 clock input may be driven by the output of respective CK level shifters 204, 210, 216, and thus $CLK_{is}$, $CLK_{fs}$, or $CLK_{ds}$, depending in which SSD circuit that frequency divider 300 is implemented. DFF 304 creates a signal on its positive output Q that is of the same amplitude but half the frequency of its clock input. The frequency division may be accomplished by routing the negative output of DFF 304 to the D input of DFF 304 in feedback fashion. DFF 304 may include a reset input to initialize the flip-flop state to a known value. DFF 304 may be configured to receive reset signals from correction circuit 101, or any other suitable correction circuit. DFF 304 may require reset if output signals of SSD circuits 130, 132, 134 are out of phase, more precisely if signals $\varphi_{1i}$, $\varphi_{1f}$, and $\varphi_{1d}$ are out-of-phase with respect to each other, or if signals $\varphi_{2i}$, $\varphi_{2f}$, and $\varphi_{2d}$ are out-of-phase with respect to each other. Moreover, DFF 304 may require reset if transient voltage steps are observed in various parts of CFIA 102. These may include power transient steps experienced in input common-mode voltage, feedback common-mode voltage, or demodulator common-mode voltage.

Non-overlap circuit 306 may be connected to the output of DFF 304. Non-overlap circuit 306 may be configured to generate separate signals that may be referred to generally as $\varphi_1$ and $\varphi_2$. In particular, non-overlap circuit 306 may be configured to generate signals $\varphi_{1i}$ and $\varphi_{2i}$, $\varphi_{1f}$ and $\varphi_{2f}$, or $\varphi_{1d}$ and $\varphi_{2d}$, depending on which SSD circuit that frequency divider 300 is implemented. Non-overlap circuit 306 may be configured to ensure that there is no overlap between signals $\varphi_1$ and $\varphi_2$.

Frequency divider 300, including DFF 304 and non-overlap circuit 306, may be powered by voltage rails according to signals received from respective CM sensing circuits 206, 212, 218, depending in which SSD circuit that frequency divider 300 is implemented. In input SSD 130, frequency divider 300 may have a positive voltage rail of $(V_{CMI}+V_{CK})$ and a negative voltage rail of $V_{CMI}$. Thus, the signals $\varphi_{1i}$ and $\varphi_{2i}$ may swing between a minimum value of \Tom and maximum value of $(V_{CMI}+V_{CK})$. The signals $\varphi_{1i}$, and $\varphi_{2i}$ may be the inverse, complement, or 180°-degree phase-shifted version of each other and have the frequency and amplitude of the output of DFF 304. The "on" or logical high values of the signals $\varphi_{1i}$ and $\varphi_{2i}$ might not overlap with each other because of non-overlap circuit 306, and thus not both be equal to $(V_{CMI}+V_{CK})$ at the same time.

In feedback SSD 132, frequency divider 300 may have a positive voltage rail of $(V_{CMF}+V_{CK})$ and a negative voltage rail of $V_{CMF}$. Thus, the signals $\varphi_{1f}$ and $\varphi_{2f}$ may swing between a minimum value of $V_{CMF}$ and maximum value of $(V_{CMF}+V_{CK})$. The signals $\varphi_{1f}$ and $\varphi_{2f}$ may be the inverse, complement, or 180°-degree phase-shifted version of each other and have the frequency and amplitude of the output of DFF 304. The "on" or logical high values of the signals $\varphi_{1f}$ and $\varphi_{2f}$ might not overlap with each other because of non-overlap circuit 306, and thus not both be equal to $(V_{CMF}+V_{CK})$ at the same time.

In demodulator SSD 134, frequency divider 300 may have a positive voltage rail of $(V_{CMD}+V_{CK})$ and a negative voltage rail of $V_{CMD}$. Thus, the signals $\varphi_{1d}$ and $\varphi_{2d}$ may swing between a minimum value of $V_{CMD}$ and maximum value of $(V_{CMD}+V_{CK})$. The signals $\varphi_{1d}$ and $\varphi_{2d}$ may be the inverse, complement, or 180°-degree phase-shifted version of each other and have the frequency and amplitude of the output of DFF 304. The "on" or logical high values of the signals $\varphi_{1d}$ and $\varphi_{2d}$ might not overlap with each other because of non-overlap circuit 306, and thus not both be equal to $(V_{CMD}+V_{CK})$ at the same time.

The common-mode voltages $V_{CMI}$, $V_{CMF}$, and $V_{CMD}$ may differ. Thus, the signals $\varphi_{1i}$ and $\varphi_{2i}$, $\varphi_{1f}$ and $\varphi_{2f}$, and $\varphi_{1d}$ and $\varphi_{2d}$ may also differ from one another. For proper operation it may be essential that the phase of $\varphi_{1i}$ match the phase of $\varphi_{1f}$. Furthermore, it may be essential that the phases of $\varphi_{1i}$ and $\varphi_{1f}$ match the phase of $\varphi_{1d}$. Similarly, it may be essential that the phase of $\varphi_{2i}$ match the phase of $\varphi_{2f}$. Furthermore, it may be essential that the phases of $\varphi_{2i}$ and $\varphi_{2f}$ match the phase of $\varphi_{2d}$. If any such signals are out-of-phase, a positive feedback condition may arise and CFIA 102 may enter a locked-up condition. The signals $\varphi_1$ and $\varphi_2$ are generated by circuits in frequency divider 300 that are in turn powered by CM sensing circuits 206, 212, 218. Therefore, modulation and demodulation operation is dependent upon common mode voltages of the input and the feedback ports, and upon the output of transconductors 124, 126. A common mode transient step, jump, or other anomaly on the input port $(V_{IN+}, V_{IN-})$, feedback port $(V_{REF}, V_{FB})$, on the outputs of transconductors 124, 126, or at power-up may thus cause signals $\varphi_{1i}$, $\varphi_{1f}$, and $\varphi_{1d}$ to become out of phase with each other and $\varphi_{2i}$, $\varphi_{2f}$, and $\varphi_{2d}$, to become out of phase with each other. Accordingly, correction circuit 101 may be configured to reset instances of frequency divider 300 through the reset input of DFF 304 in any such conditions to make sure that the signals remain synchronized with respect to phase.

FIG. 4 illustrates a correction circuit 400, in accordance with embodiments of the present disclosure. Correction circuit 400 may implement correction circuit 101 of FIG. 1. Circuit 400 may be configured to ensure that signals controlling modulators 122, 128 and demodulator 118 remain synchronized to avoid a positive feedback condition. Circuit 400 may include a phase comparator 430 and power-on-reset ("POR") circuits 406, 408, 434.

Correction circuit 400 may be configured to generate or control startup values for DFF 304 by issuing reset signals. POR circuit 406 may continuously monitor the sensed voltages $V_{CMI}$ and $(V_{CMI}+V_{CK})$ from input CM sensing circuit 206. POR circuit 408 may continuously monitor the sensed voltages $V_{CMF}$ and $(V_{CMF}+V_{CK})$ from feedback CM sensing circuit 212. POR circuit 434 may continuously monitor the sensed voltages $V_{CMD}$ and $(V_{CMD}+V_{CK})$ from demodulator CM sensing circuit 218. POR circuits 406, 408, 434 may monitor these voltages and generate a reset pulse if these voltages drop below preset thresholds. POR circuits 406, 408, 434 may maintain the reset pulses until the voltages return to a level above the preset thresholds. The preset thresholds may correspond to, for example, a power-on transient condition or if $V_{CMI}$, $V_{CMF}$ or $V_{CMD}$ exceed their valid operating ranges.

POR circuits 406, 408, 434 might not detect all cases where the $\varphi_1$ or $\varphi_2$ signals to drive modulators and demodulator operation become unsynchronized. The $\varphi_1$ or $\varphi_2$ signals may become unsynchronized, for example, due to short transient pulses on the input port or feedback port or on the supply voltage. Thus, correction circuit 400 also contains phase comparator 430 to continuously monitor $\varphi_1$ or $\varphi_2$ signals, or versions thereof.

Frequency dividers 202, 208, 214 may generate $\varphi_{1i}$, $\varphi_{2i}$, $\varphi_{1f}$, $\varphi_{2f}$, $\varphi_{1d}$, and $\varphi_{2d}$ signals, respectively, and pass these signals (or a subset of these signals) to phase comparator 430 via level shifters 426, 428, 440. Level shifters 426, 428, 440 may be configured to shift signals vii, $\varphi_{2i}$, $\varphi_{1f}$, $\varphi_{2f}$, $\varphi_{1d}$, and $\varphi_{2d}$ to a voltage level appropriate for phase comparator 430.

Phase comparator 430 might only need to compare the signals of one set of signals—$\varphi_{1i}$, $\varphi_{1f}$, and $\varphi_{1d}$ (as shifted by level shifters 426, 428, 440); or $\varphi_{2i}$, $\varphi_{2f}$, and $\varphi_{2d}$ (as shifted by level shifters 426, 428, 440)—against each other. An error in one such set of signals would also be manifested in the other set of signals. Thus, only one set of signals—$\varphi_{1i}$, $\varphi_{1f}$, and $\varphi_{1d}$ (as shifted by level shifters 426, 428, 440); or $\varphi_{2i}$, $\varphi_{2f}$, and $\varphi_{2d}$ (as shifted by level shifters 426, 428, 440)—might need to be compared by phase comparator 430. Thus, level shifters 426, 428, 440 might only send shifted versions of $\varphi_{1i}$, $\varphi_{1f}$, $\varphi_{1d}$, respectively, to phase comparator, or only send shifted versions of $\varphi_{2i}$, $\varphi_{2e}$, and $\varphi_{2d}$, respectively, to phase comparator 430. The output of level shifters 426, 428, 440 may be referred to as $\varphi_{i\_1s}$, $\varphi_{f\_1s}$, and $\varphi_{d\_1s}$, respectively. The signal $\varphi_{i\_1s}$ may include one of $\varphi_{1i}$ or $\varphi_{2i}$. The signal $\varphi_{f\_1s}$ may include one of $\varphi_{1f}$ or $\varphi_{2f}$. The signal $\varphi_{d\_1s}$ may include one of $\varphi_{1d}$ or $\varphi_{2d}$.

Phase comparator 430 may be configured to generate a reset pulse whenever phase comparator 430 detects an out-of-phase condition between one or more of: $\varphi_{i\_1s}$ and $\varphi_{f\_1s}$; $\varphi_{i\_1s}$ and $\varphi_{d\_1s}$; or $\varphi_{f\_1s}$ and $\varphi_{d\_1s}$. In various embodiments, one, two, or all three such comparisons may be made by phase comparator. An example implementation of phase comparator 430 is shown below in FIG. 5. The reset pulse may be sent to an OR gate implementation of logic 432. The reset pulse may be maintained for as long as the out-of-phase condition is detected.

If at least one of the POR circuit 406, POR circuit 408, POR circuit 434, or phase comparator 430 generates a reset pulse, logic 432 may be configured to output a reset signal that is sent to level shifters 414, 416, 438 to generate reset pulses $RESET_{IN}$, $RESET_{FB}$ and $RESET_{DMOD}$ respectively. Level shifters 414, 416, 438 may be configured to match the amplitude of the reset signals to levels expected by frequency dividers 202, 208, 214. $RESET_{IN}$, $RESET_{FB}$ and $RESET_{DMOD}$ pulses may be sent to the 'Reset' inputs of DFFs in frequency dividers 202, 204, and 214. The reset pulses may be maintained until the sensed voltages on the inputs of POR circuits 406, 408, 434 return to acceptable levels, or until the out-of-phase condition detected by phase comparator 430 is removed.

Correction circuit 400 may thus be configured to perform clock recovery. Correction circuit 400 may thus be configured to monitor high side supplies, including sensed common mode voltages on the input voltage and feedback input ports, and perform reset operations should these voltages exceed valid operating ranges. Correction circuit 400 may thus be configured to reset DFFs 304 of frequency dividers 202, 208, 214 in case of undervoltage (that is, a POR function). Correction circuit 400 may thus be configured to monitor clock signals and ensure that the clock signals start in-phase after a POR event. Correction circuit 400 may thus be configured to reset DFFs 304 if an out-of-phase condition is detected as a consequence of an event other than undervoltage. As a result, correction circuit 400 may be configured to ensure that all clocks are synchronized in CFIA 102, thus avoiding a positive feedback condition. A POR event or voltage event may include under-voltage, over-voltage, or power transient event.

POR circuits 406, 408, 434 may be implemented by any suitable circuitry. POR circuits may include a comparator that compares a received voltage (such as $V_{CMI}+V_{CK}$ or $V_{CMF}+V_{CK}$ or $V_{CMD}+V_{CK}$) to a fixed reference. The reference may be, for example, 75% of an expected value. If the DC voltages $(V_{CMI}+V_{CK})$ or $(V_{CMF}+V_{CK})$ or $(V_{CMD}+V_{CK})$ drop below 75% of its expected value, the comparator output will become logic high. Output of POR circuits 406, 408, 434 may be level-shifted by level shifters 410, 412, 436 respectively, and fed as inputs to logic 432.

Phase comparator 430 may be implemented by any suitable circuitry. For example, phase comparator 430 may be implemented with an XOR logic operation. The signal $\varphi_{i\_1s}$ may be compared to $\varphi_{f\_1s}$ and, if they are unequal, XOR logic of phase comparator 430 may be become active (high) and trigger reset signals $RESET_{IN}$, $RESET_{FB}$, $RESET_{DMOD}$ via logic 432 and level shifters 414, 416, 438. Similarly, $\varphi_{i\_1s}$ or $\varphi_{f\_1s}$ may be compared to $\varphi_{d\_1s}$ and, if they are unequal, separate XOR logic may become active (high) and trigger reset signals $RESET_{IN}$, $RESET_{FB}$, $RESET_{DMOD}$ via logic 432 and level shifters 414, 416, 438.

Other elements of FIG. 4 may be implemented by any suitable combination of digital or analog circuitry.

In various embodiments, correction circuit 400 may be configured to perform only a subset of the monitoring capabilities illustrated in FIG. 4. For example, correction circuit 400 may be configured to only monitor common mode voltage from the input and feedback ports. In such a case, demodulator POR 434, shifter 436, shifter 438, and shifter 440 might not be used. Furthermore, phase comparator 430 might only be configured to compare $\varphi_{i\_1s}$ with $\varphi_{f\_1s}$, and not make any comparisons with $\varphi_{d\_1s}$.

Figure 5:
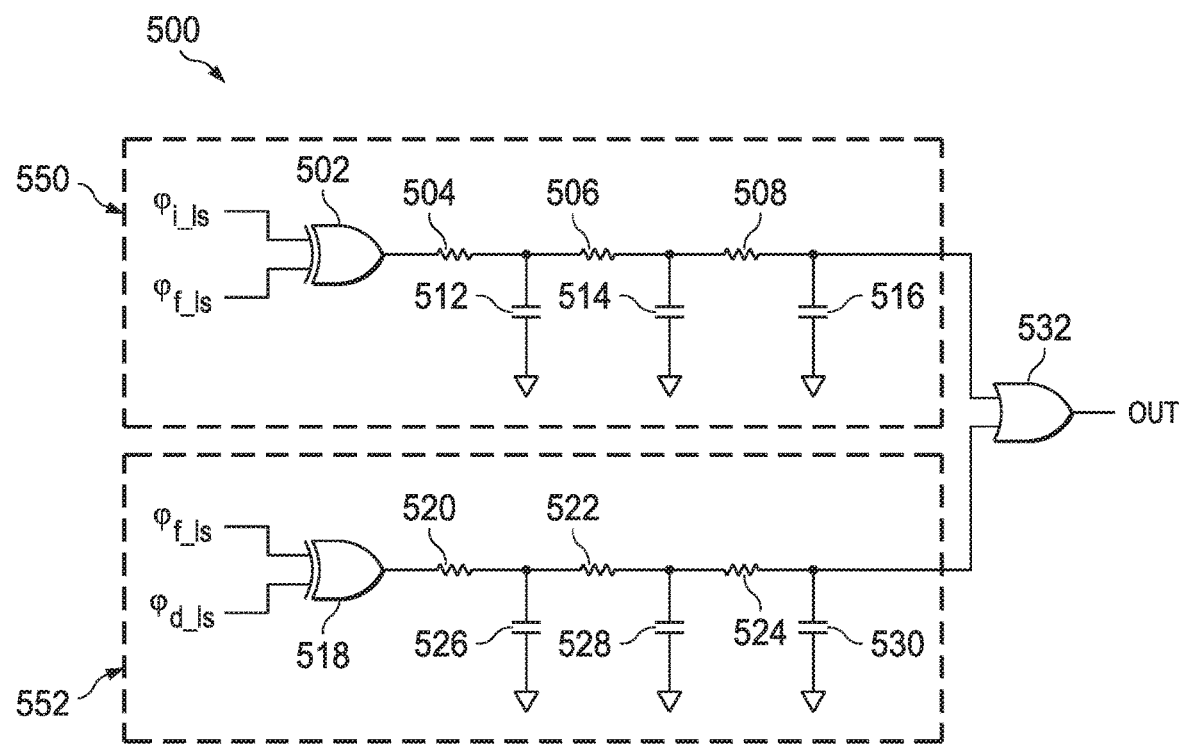
FIG. 5 is a diagram of a phase comparator, according to embodiments of the present disclosure.

FIG. 5 illustrates an example implementation of a phase comparator 500, according to embodiments of the present disclosure. Phase comparator 500 may implement phase comparator 430 of FIG. 4.

Phase comparator 500 may include a logic stage 550 to compare one pair of signals from the set of signals $\varphi_{i\_1s}$, $\varphi_{f\_1s}$, and $\varphi_{d\_1s}$, and another logic stage 552 to compare a different pair of signals from the set of signals $\varphi_{i\_1s}$, $\varphi_{f\_1s}$, and $\varphi_{d\_1s}$. In the example of FIG. 5, logic stage 550 may be configured to compare the signals $\varphi_{i\_1s}$ and $\varphi_{f\_1s}$, while logic stage 552 may be configured to compare the signals $\varphi_{f\_1s}$, and $\varphi_{d\_1s}$. The combination of these comparisons may ensure that if there is any difference between the signals $\varphi_{i\_1s}$, $\varphi_{f\_1s}$, and $\varphi_{d\_1s}$, a reset may be generated. In another example, logic stage 550 may be configured to compare the signals $\varphi_{i\_1s}$ and $\varphi_{f\_1s}$, while logic stage 552 may be configured to compare the signals $\varphi_{i\_1s}$, and $\varphi_{d\_1s}$. Any suitable selection of signals to be compared by respective logic stages 550, 552 may be made as long as any difference between the signals $\varphi_{i\_1s}$, $\varphi_{f\_1s}$, and $\varphi_{d\_1s}$ is detected. In some embodiments, phase comparator 500 may be configured to only evaluate the difference between two signals of the set of signals $\varphi_{i\_1s}$, $\varphi_{f\_1s}$, and $\varphi_{d\_1s}$. In such embodiments, only one of logic stages 550, 552 need to be used and the output of phase comparator 500 may be the output of such a logic stage.

Phase comparator 500 may receive $\varphi_{i\_1s}$, $\varphi_{f\_1s}$, and $\varphi_{d\_1s}$, signals from level shifters 426, 428, 440. These may be, for example, $\varphi_{1i}$, $\varphi_{1f}$, or $\varphi_{1d}$ signals level-shifted for logic operations.

In logic stage 550, signals $\varphi_{i\_1s}$ and $\varphi_{f\_1s}$ may be input to an XOR gate 502. If the $\varphi_{i\_1s}$ and $\varphi_{f\_1s}$ signals are out of phase with each other, then a logical high value may be issued. Resistors 504, 506, 508 may be connected in series with each other, leading to an output. Capacitors 512, 514, 516 may be placed between the terminals of each of resistors 504, 506, 508 and ground. The RC network constructed from resistors 504, 506, 508 and capacitors 512, 514, 516 may preserve the outputted logical high value sufficient to issue an output voltage value to trigger a reset signal and avoid presenting a reset signal for transients.

Similarly, signals $\varphi_{f\_1s}$ and $\varphi_{d\_1s}$ may be input to an XOR gate 518. If the $\varphi_{f\_1s}$ and $\varphi_{d\_1s}$ signals are out of phase with each other, then a logical high value may be issued. Resistors 520, 522, 524 may be connected in series with each other, leading to an output. Capacitors 526, 528, 530 may be placed between the terminals of each of resistors 520, 522, 524 and ground. The RC network constructed from resistors 520, 522, 524 and capacitors 526, 528, 530 may preserve the outputted logical high value sufficient to issue an output voltage value to trigger a reset signal and avoid presenting a reset signal for transients.

Output from XOR gates 502, 528 routed through the respective RC networks may be input into an OR gate 532. Thus, if $\varphi_{i\_1s}$ and $\varphi_{f\_1s}$ are out of phase with respect to each other, or if $\varphi_{f\_1s}$ and $\varphi_{d\_1s}$ are out of phase with respect to each other, phase comparator 500 may be configured to issue a reset signal on its output.

Figure 6:
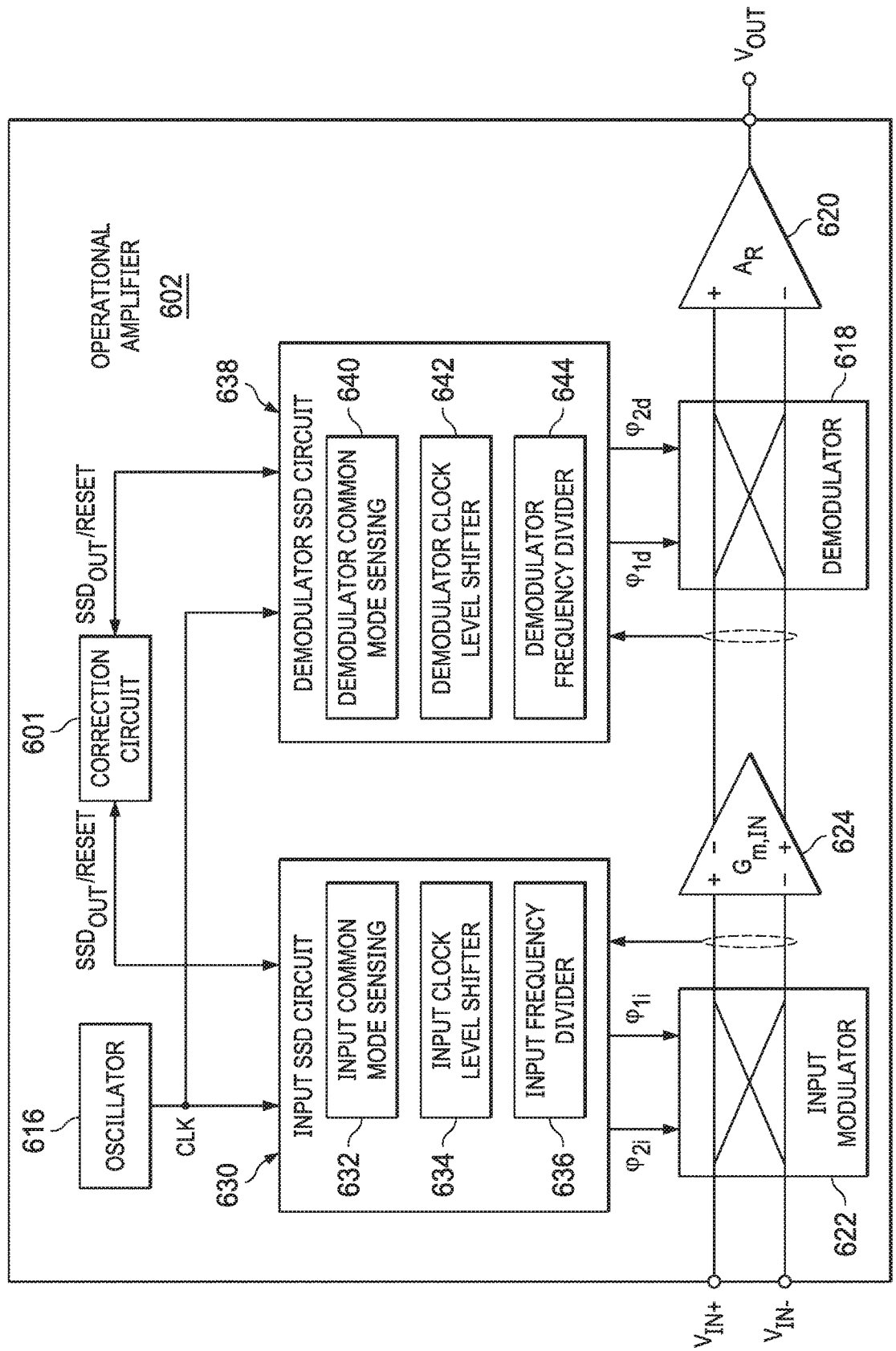
FIG. 6 is a diagram of an operational amplifier, according to embodiments of the present disclosure.

FIG. 6 is a diagram of an operational amplifier ("op-amp") 602 that may use an instance of a correction circuit, according to embodiments of the present disclosure. Op-amp 602 may employ common-mode sensing, where one voltage domain is that of an input modulator 622 at the input common mode voltage for op-amp 602, and another voltage domain is that of a demodulator 618 at the output of a first stage transconductor 624.

Op-amp 602 may include a differential input, $V_{IN}$, equal to ($V_{IN+}-V_{IN-}$).

Input modulator 622 may be connected between the $V_{IN}$ ports and inputs of transconductor 624. Input modulator 622 may otherwise be implemented as an instance of modulator 122 or modulator 128. Demodulator 618 may be connected between an output of transconductor 624 and an input of a second stage amplifier 620. Demodulator 618 may otherwise be implemented as an instance of demodulator 118. Oscillator 616 may be implemented in the same manner as oscillator 116 of FIG. 1.

Op-amp 602 may include an input SSD circuit 630 and a demodulator SSD circuit 638. Input SSD circuit 630 and demodulator SSD circuit 638 may be implemented in the same manner as SSD circuits 130, 134 of FIGS. 1, 2A, and 2B. Input SSD circuit 630 may include an input CM sensing circuit 632, an input CK level shifter 634, and an input frequency divider 636. Demodulator SSD circuit 638 may include a demodulator CM sensing circuit 640, a demodulator CK level shifter 642, and a demodulator frequency divider 644. Input SSD circuit 630 and demodulator SSD circuit 638 may receive a clock signal, CLK, from oscillator 616.

Through input CM sensing circuit 632, input SSD circuit 630 may be configured to sense common-mode voltage at the input of transconductor 624. Input CM sensing circuit 632 may be configured to provide the sensed common mode voltage, $V_{CMI}$, and ($V_{CMI}+V_{CK}$) to CK level shifter 634 and to frequency divider 636. CK level shifter 634 may be configured to change the voltage range of CLK according to the sensed common mode voltage in the same way as described above within the context of FIGS. 2A and 2B and provide the shifted version of CLK to input frequency divider 636. Input frequency divider 636 may be implemented with a DFF such as shown in FIG. 3 and may be configured to divide the frequency of its received signal and to output control signals for gates of transistors in input modulator 622. The control signals may be denoted as $\varphi_{1i}$ and $\varphi_{2i}$. Input SSD circuit 630 may be configured to provide its information to a correction circuit 601 and to receive reset signals from correction circuit 601 to reset generation of signals by input frequency divider 636.

Through demodulator CM sensing circuit 640, demodulator SSD circuit 638 may be configured to sense common-mode voltage at the input of amplifier 620. Demodulator CM sensing circuit 640 may be configured to provide the sensed common mode voltage, $V_{CMD}$, and ($V_{CMD}+V_{CK}$) to demodulator CK level shifter 642 and to demodulator frequency divider 644. Demodulator CK level shifter 644 may be configured to change the voltage range of CLK according to the sensed common mode voltage in the same way as described above within the context of FIGS. 2A and 2B and provide the shifted version of CLK to demodulator frequency divider 644. Demodulator frequency divider 644 may be implemented with a DFF such as shown in FIG. 3 and may be configured to divide the frequency of its received signal and to output control signals for gates of transistors in demodulator 618. The control signals may be denoted as $\varphi_{1d}$ and $\varphi_{2d}$. Demodulator SSD circuit 638 may be configured to provide its information to a correction circuit 601 and to receive reset signals from correction circuit 601 to reset generation of signals by demodulator frequency divider 644.

As described within the context of CFIA 102, signals $\varphi_{1d}$ and $\varphi_1$, may become out of phase with respect to each other. Furthermore, signals $\varphi_2$, and $\varphi_{2a}$ may become out of phase with respect to each other. Correction circuit 601 may be configured to detect such conditions and send reset signals to SSD circuits 630, 638 upon such conditions or upon power-on transient conditions that are detected.

Figure 7:
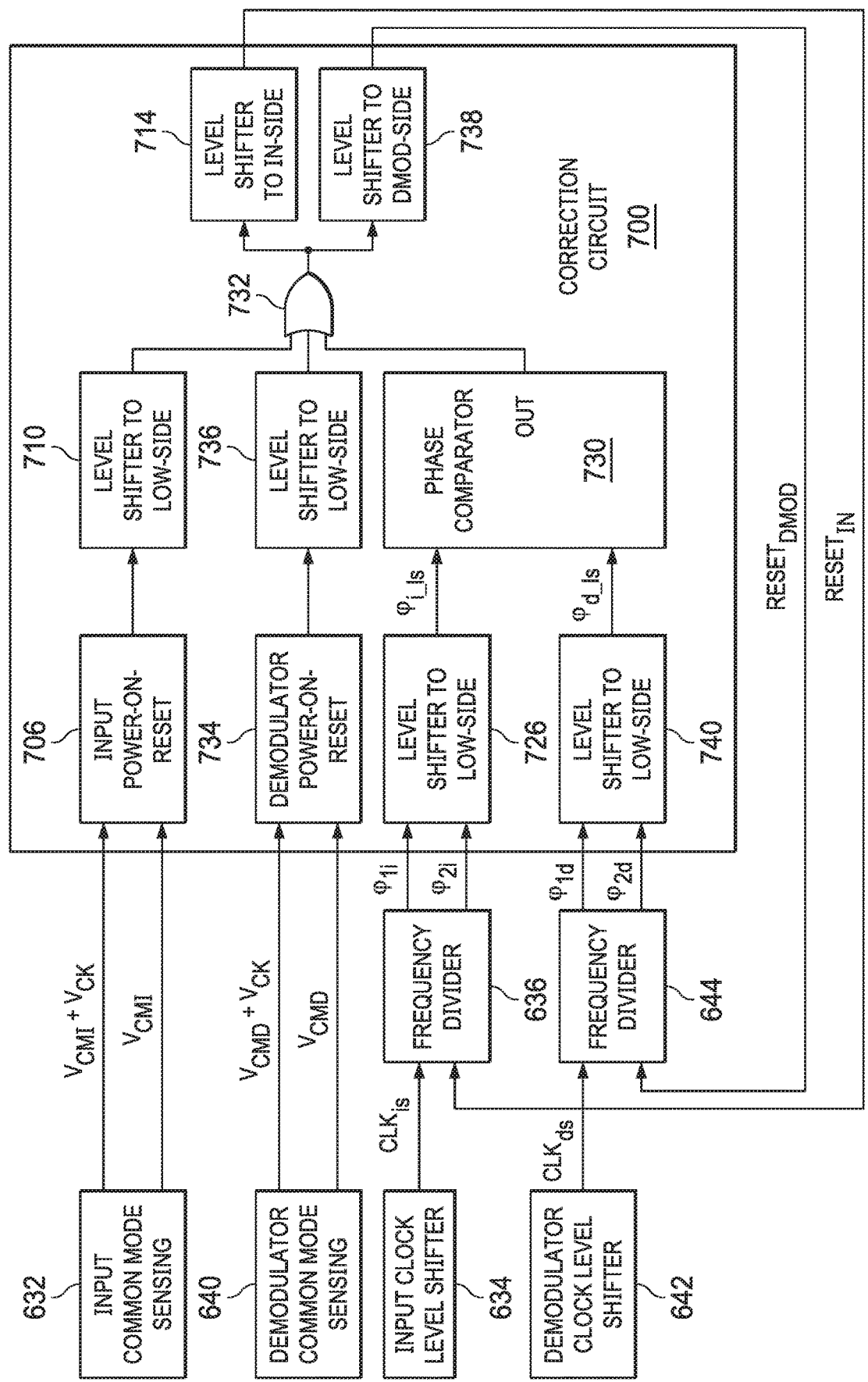
FIG. 7 is a diagram of another correction circuit for an operational amplifier, according to embodiments of the present disclosure.

FIG. 7 is a diagram of another correction circuit 700 for an op-amp, according to embodiments of the present disclosure. Correction circuit 700 may implement correction circuit 601 of FIG. 6. Correction circuit 700 may be configured to perform out-of-phase correction for SSD circuits 630, 638, input modulator 622, and demodulator 618 of op-amp 602.

Correction circuit 700 may be implemented in a similar way to correction circuit 400. Correction circuit 700 may include an input POR 706, level shifter 710, level shifter 714, demodulator POR 734, level shifter 736, level shifter 738, level shifter 726, and level shifter 740 that may be implemented in the same way as input POR 406, level shifter 410, level shifter 414, demodulator POR 434, level shifter 436, level shifter 438, level shifter 426, and level shifter 440, respectively. Correction circuit 700 may include a phase comparator 730. Correction circuit 700 may include logic 732 such as an OR gate.

Input POR 706 may be configured to receive ($V_{CMI}+V_{CK}$) and $V_{CMI}$ from input CM sensing circuit 632. If the values of these voltages fall below certain thresholds, input POR 706 may be configured to issue a logical high reset signal that may be shifted by level shifter 710 to be applied to logic 732.

POR 734 may be configured to receive ($V_{CMD}+V_{CK}$) and $V_{CMD}$ from demodulator CM sensing circuit 640. If the values of these voltages fall below certain thresholds, demodulator POR 734 may be configured to issue a logical high reset signal that may be shifted by level shifter 736 to be applied to logic 732.

The output of level shifters 726, 740 may be referred to as $\varphi_{i\_1s}$ and $\varphi_{d\_1s}$, respectively. The signal $\varphi_{i\_1s}$ may include one of $\varphi_{1i}$ or $\varphi_{2i}$. The signal $\varphi_{d\_1s}$ may include one of $\varphi_{1d}$ or $\varphi_{2d}$.

Phase comparator 730 may be configured to determine whether the phases of $\varphi_{i\_1s}$ and $\varphi_{d\_1s}$ do not match. If the phases do not match, phase comparator 730 may be configured to issue a logical high reset signal as output. Phase comparator 730 may be implemented in any suitable embodiment. For example, phase comparator 730 may be implemented by a single logic stage of phase comparator 500, such as logic stage 550, wherein $\varphi_{i\_1s}$ and $\varphi_{d\_1s}$ are the inputs to XOR gate 502. In such an implementation, output of logic stage 550 may be the output of phase comparator 730.

Logic 732 may be configured to issue a logical high reset signal if any of input POR circuit 706, demodulator POR circuit 734, or phase comparator 730 issues a logical high reset signal. POR circuit 706, demodulator POR circuit 734, and phase comparator 730 may be configured to continue to issue a logical high reset signal until the condition causing the reset is cleared. Logic 732 may be configured to issue its output through level shifters 714, 738, which may produce $RESET_{IN}$ and $RESET_{DMOD}$, respectively. $RESET_{IN}$ may be routed to input frequency divider 636 for resetting the DFF therein. $RESET_{DMOD}$ may be routed to demodulator frequency divider 644 for resetting the DFF therein.

Thus, as shown, embodiments of the present disclosure may be used in any amplifier, whether low-voltage or high voltage, or operational or instrumentation, that makes use of CM sensing.

The elements of the correction circuits and amplifiers discussed above may be implemented with analog circuitry, digital circuitry, or any suitable combination thereof. The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. An apparatus, comprising:
   an amplifier;
   an input port;
   a first modulator circuit connected to the input port; and
   a correction circuit configured to:
   determine a common mode voltage of the input port;
   receive a first clock signal;
   manipulate, based at least in part upon the common mode voltage of the input port, the first clock signal to generate a second clock signal, the second clock signal produced for the first modulator circuit;
   determine whether the second clock signal is out of phase with a third clock signal; and
   based upon a determination that the second clock signal is out of phase with the third clock signal, reset the second clock signal.

2. The apparatus of claim 1, further comprising a feedback port and a second modulator circuit connected to the feedback port, wherein:
   the third clock signal is produced for the second modulator circuit; and
   the correction circuit is further configured to:
   determine a common mode voltage of the feedback port from the second modulator circuit;
   determine whether a voltage event of the common mode voltage of the feedback port has occurred; and
   reset the second clock signal and reset the third clock signal based upon a determination:
   of occurrence of the voltage event of the common mode voltage of the feedback port;
   or
   that the second clock signal produced is out of phase with the third clock signal.

3. The apparatus of claim 1, further comprising a demodulator circuit connected to the amplifier, wherein the third clock signal is produced for the demodulator circuit.

4. The apparatus of claim 1, wherein the amplifier is of an operational amplifier.

5. The apparatus of claim 1, wherein the amplifier is of an instrumentation amplifier.

6. The apparatus of claim 1, wherein the correction circuit is further configured to determine whether a voltage event of the common mode voltage of the input port has occurred.

7. The apparatus of claim 6, wherein the voltage event is an undervoltage, an overvoltage event, or a transient voltage event arising from the common mode voltage of the input port.

8. The apparatus of claim 6, wherein the correction circuit is further configured to, based on a determination of occurrence of the voltage event of the common mode voltage of the input port, reset the second clock signal.

9. The apparatus of claim 1, wherein the reset of the second clock signal includes a reset of a frequency divider.

10. A method, comprising:
    determining a common mode voltage of an input port of an amplifier;
    receiving a first clock signal;
    manipulating, based at least in part upon the common mode voltage of the input port, the first clock signal to generate a second clock signal, the second clock signal produced for a first modulator circuit of the amplifier;

determining whether the second clock signal is out of phase with a third clock signal; and based upon a determination that the second clock signal is out of phase with the third clock signal, resetting the second clock signal.

11. The method of claim 10, wherein the third clock signal is produced for a second modulator circuit of the amplifier, and the method further comprises:

determining a common mode voltage of a feedback port from the second modulator circuit;

determining whether a voltage event of the common mode voltage of the feedback port has occurred; and resetting the second clock signal and resetting the third clock signal based upon a determination:

of occurrence of the voltage event of the common mode voltage of the feedback port; or that the second clock signal produced is out of phase with the third clock signal.

12. The method of claim 10, wherein the third clock signal is produced for a demodulator circuit of the amplifier.

13. The method of claim 10, further comprising determining whether a voltage event of the common mode voltage of the input port has occurred.

14. The method of claim 13, wherein the voltage event is an undervoltage, an overvoltage event, or a transient voltage event arising from the common mode voltage of the input port.

15. The method of claim 13, further comprising, based on a determination of occurrence of the voltage event of the common mode voltage of the input port, resetting the second clock signal.

16. The method of claim 10, wherein the reset of the second clock signal includes a reset of a frequency divider.

17. A system, comprising:
an amplifier;
an input port;
a first modulator circuit connected to the input port; and
a correction circuit configured to:
determine a common mode voltage of the input port;
receive a first clock signal;
manipulate, based at least in part upon the common mode voltage of the input port, the first clock signal to generate a second clock signal, the second clock signal produced for the first modulator circuit;

determine whether the second clock signal is out of phase with a third clock signal; and based upon a determination that the second clock signal is out of phase with the third clock signal, reset the second clock signal.

18. The system of claim 17, further comprising a feedback port and a second modulator circuit connected to the feedback port, wherein:

the third clock signal is produced for the second modulator circuit; and the correction circuit is further configured to:

determine a common mode voltage of the feedback port from the second modulator circuit;

determine whether a voltage event of the common mode voltage of the feedback port has occurred; and reset the second clock signal and reset the third clock signal based upon a determination:

of occurrence of the voltage event of the common mode voltage of the feedback port;

or that the second clock signal produced is out of phase with the third clock signal.

19. The system of claim 17, wherein:

the correction circuit is further configured to determine whether a voltage event of the common mode voltage of the input port has occurred; and the voltage event is an undervoltage, an overvoltage event, or a transient voltage event arising from the common mode voltage of the input port.

20. The system of claim 17, wherein the correction circuit is further configured to:

determine a common mode voltage of the feedback port from the second modulator circuit;

determine whether a voltage event of the common mode voltage of the feedback port has occurred; and based on a determination of occurrence of the voltage event of the common mode voltage of the input port, reset the second clock signal.

* * * * *